US006636561B1

(12) United States Patent
Hudson

(10) Patent No.: US 6,636,561 B1
(45) Date of Patent: Oct. 21, 2003

(54) CHANNEL EQUALISERS

(75) Inventor: John E Hudson, Stansted (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/342,359

(22) Filed: Jun. 29, 1999

(51) Int. Cl.$^7$ .............................................. H03K 5/159
(52) U.S. Cl. ...................... 375/232; 375/148; 375/235; 375/260; 712/19
(58) Field of Search ................................ 375/232, 148, 375/235, 260, 229; 364/724.2; 712/19; 379/406.08

(56) References Cited

U.S. PATENT DOCUMENTS

| | | | | |
|---|---|---|---|---|
| 5,018,065 A | * | 5/1991 | McWhirter et al. ............ | 712/19 |
| 5,649,011 A | * | 7/1997 | Garofalo et al. ....... | 379/406.08 |
| 5,761,237 A | * | 6/1998 | Petersen et al. ............ | 375/148 |
| 5,777,910 A | * | 7/1998 | Lu ........................... | 364/724.2 |
| 6,097,763 A | * | 8/2000 | Djokovic et al. ........... | 375/260 |

OTHER PUBLICATIONS

Proceedings of the IEEE, vol. 71, No. 12,Dec. 1983—On the Relation Between Triangular Matrix Decomposition and Linear Prediction—C W Therrien.
Practical Optimization—Philip E Gill, Walter Murray, Margaret Wright.
Fast Signal Acquisition by an Adaptive Antenna moving in a Multipath Field—IEE Proceedings, vol. 134, Pt.H, No. 2 Apr. 1987—J. E. Hudson.
Technical memorandum—Fast allocation of Degrees of Freedom in a Adaptive Antenna—IEE proceedings, vol. 133, Pt.H, No. 6, Dec. 1986—John Hudson.

* cited by examiner

*Primary Examiner*—Shuwang Liu
(74) *Attorney, Agent, or Firm*—Barnes & Thornburg

(57) ABSTRACT

The present invention provides a method whereby an adaptive equaliser is applied to the terminal (mobile) receivers in a cellular radio CDMA system whose purpose is to minimise the mutual interference between users sharing the same radio channel. The application relevant to third generation cellular systems which consist of UTRA (or WBCDMA) in Europe and CDMA2000 in the USA (or future merged standards variants of these systems), and has a special application to the time domain duplex (TDD) mode of these systems. An algorithm is provided whereby the equaliser is adapted to conform to some recognised optimality criterion which is known to lead to a minimum mutual interference situation. One method is the constrained minimum output finite impulse response (FIR) digital filter power condition, but the technique is not limited to this criterion. The method reduces the computation load of a digital filter by selecting a sparse subset of delay line taps which are actively weighted and used as a filter. The rest of the delay line taps are ignored. The active subsets are optimized.

17 Claims, 4 Drawing Sheets

MMSE equaliser with tap search

Standard MMSE full-tap equaliser

Reduced-tap MMSE equaliser

MMSE equaliser with tap search

CHANNEL EQUALISERS

FIELD OF THE INVENTION

The present invention relates to channel equalisers and, in particular, channel equalisers for multi-user Code Division Multiple Access (CDMA) receivers.

BACKGROUND OF THE INVENTION

In the proposed European Universal Terrestrial Radio Access (UTRA) third generation cellular implementation of Universal Mobile Telecommunication Service (UMTS) there is a problem in the downlink direction (base station to subscriber) relating to the computation load of the terminals when the channels are highly dispersive. In the Time Division Duplex (TDD) mode the spreading factor is only 16 i.e. one channel information bit corresponds to 16 chips and performance is at a premium. Channel effects such as dispersion render the 16 user codes non-orthogonal and mutual interference can be high, reducing system capacity. Current proposals are to use a common front-end equaliser for the terminals which re-whitens the channel impulse response and remove this mutual interference. It is presently envisaged that the TDD mode will be employed for data and voice since, in the unpaired spectrum, it is better suited to highly asymmetric bandwidth (e.g. 15:1) applications. FIG. 1 shows the stages involved in the transmission and reception of radio signals from a digital pulse shaper at a transmitter to a receiver.

The equaliser (filter) conventionally proposed for CDMA down links is an Finite Impulse Response (FIR) digital filter which operates at baseband in the receiver. The channel dispersion may extend up to 20 $\mu$ s for the worst vehicular channels (IMT-2000 selection criteria documents), which is equivalent to 83 channel symbols at the UTRA chipping rate of 4.096 MHz. The chipping rate refers to the lowest symbol rate of the channel. Thus this filter may have a large number of taps and the work load is correspondingly high, being of the order of 4.096×83=340 MIPS. This may be too high a work load for a portable terminal under current technologies, so methods of reducing the load of the filter are necessary to reduce power consumption and thus conserve battery power.

There are other considerations relating to the statistical stability of the tap values if the filter has too many taps. Because the channel impulse response is estimated from a finite duration training sequence, the filter weights are determined with some random error components whose effect increases in proportion to the number of taps estimated, Thus it is always desirable to reduce the number of taps in the filter yet not compromise equalisation performance. Thus it is often proposed that the channel data can be windowed and the tap data in the window be transformed into eigenspace via the Karhunen Loeve transformation though this also has a high computational cost.

The digital processing load of a receiver equaliser has two parts: firstly the low-level digital filtering function work load at the chip rate and secondly the work load of the high-level real-time filter design algorithm which typically involves matrix manipulations which incur a heavy memory and instruction count. Efficient minimisation of the first generally involves an increase of the second component.

OBJECT OF THE INVENTION

The present invention seeks to provide a channel equaliser for multi-user CDMA receivers that provides a reduced computational load than is presently known.

The invention further seeks to provide an efficient means of designing an FIR digital equaliser filter which has a large time span, equal at least to the channel dispersion, but with only a small number of active tap weights.

STATEMENT OF THE INVENTION

In accordance with the invention, there is provided an algorithm whereby a digital filter can be adapted to conform to some recognised optimality criterion which is known to lead to a minimum mutual interference situation. The algorithm selects a sparse set of delay line taps in an optimal fashion and accordingly determines a reduced work load, The algorithm has two variants which lead to the same solution. One is a simple search procedure and the second is a numerical algorithm which has a smaller computation load. In accordance with one aspect, the method is constrained to a minimum output finite impulse response (FIR) digital filter power condition.

In accordance with a second aspect of the invention, there is provided a method comprising the determination of a sparse FIR filter which has a relatively small number of active weighting coefficients $N_{tap}$ which relates to the potential number of taps and $N_{chan}$ which is the product of the CDMA chipping rate and the span of the dispersion of the channel.

In accordance with a third aspect of the invention, there is provided a method of determining the filter taps for a digital filter on a non-ideal channel comprising the steps of:

obtaining impulse response values $\{h_0, h_1, h_2 \ldots h_n\}$ to create a channel response matrix H;

applying Givens' rotation algorithm to matrix H comprising the sub-steps of:
  (i) using a sequence of N−1 2×2 rotation operations the top row is made zero to the right of the first element;
  (ii) copying and applying identical sequences of rotations in the same order to the second and subsequent rows; and
  (iii) permuting the matrix to achieve the best value for the second diagonal element;
  (iv) repeating steps i) and ii) for the second row with a corresponding reduction to zero of the elements of each row to the right of the diagonal;
  (v) repeating steps iii) and iv) for subsequent rows up to a limit:
    whereby to produce a lower triangular matrix L;
    inverting L; and
    extracting the leading column, and mapping the element locations in W back through an inverse pivot map;
    whereby to relate the weights to the permuted row number, wherein, for each element of the leading column the mapped values of the permuted row number corresponds to the number of the selected tap to be employed of the filter and the elements of the leading column of the inverted matrix correspond to the desired weights taps of the filter.

A second method describes the operation of an algorithm which selects the best subset of coefficients to retain and the complementary set which can be discarded. A low-cost sequential pivoting QR triangular decomposition of the channel impulse response matrix is used for this function (QR is the notation employed for the product of an orthogonal matrix and an upper triangular matrix). This algorithm sequentially increases the number of taps, selecting the best new ones to use out of the total available which minimises some error measure in the resulting sparse equalisation. This QR algorithm is numerically robust, has little error propagation, and will operate with fixed point arithmetic. The total work load is proportional to $N_{chan} \cdot N_{tap}^2$ In accordance with a further aspect of the invention there is provided a FIR filter comprising a semiconductor chip (ASIC or FPGA chip) programmed to operate in accordance with the algorithm.

In accordance with another aspect of the invention, there is provided, in a filter for a non-ideal channel having a delay line with N floating tap connections and variable coefficient values, a method of determining the filter tap characteristics comprising the steps of: searching for a pivot filter tap; connecting said pivot tap to a first tap of the delay line; replacing the pivot filter tap with a variable filter tap and connecting the pivot to one of the N−1 locations remaining; and, at each pivot location optimising the first co-efficient value according to a selected optimality criterion; wherein the search is terminated when the best location for the pivot tap has been determined; determining a subset of optimal locations; determining filter tap values for said optimal locations wherein, for each sequential step of the process, M−1 variable coefficients and one pivot are provided; and the variable coefficients are connected to those delay line taps which were determined to be optimal in step M−1; wherein the mth pivot is scanned through the unused N−M−1 delay line taps remaining and the best one is found as before. and best location of the movable coefficient is decided according to a minimum residual power criterion.

In accordance with another aspect of the invention, there is provided a digital filter having a plurality of filter taps wherein the filter is operable such that a sparse sub-set of filter taps may be determined according to the following steps:

obtaining impulse response values $\{h_0, h_1, h_2 \ldots h_N\}$ to create a channel response matrix H;

applying Givens' rotation algorithm to matrix H comprising the sub-steps of:
i) using a sequence of N−1 2×2 rotation operations the top row is made zero to the right of the first element;
ii) copying and applying identical sequences of rotations in the same order to the second and subsequent rows; and
iii) permuting the matrix to achieve the best value for the second diagonal element;
iv) repeating steps i) and ii) for the second row with a corresponding reduction to zero of the elements of each row to the right of the diagonal;
v) repeating steps iii) and iv) for subsequent rows up to a limit;
whereby to produce a lower triangular matrix L; inverting L; and
extracting the leading column, and mapping the element locations in W back through an inverse pivot map
whereby for each element of the leading column the mapped values of the permuted row number corresponds to the number of the selected tap to be employed of the filter and the elements of the leading column of the inverted matrix correspond to the desired weights taps of the filter.

In accordance with another aspect of the invention, there is provided a filter for a non-deal channel having a delay line with N stages and M connections with variable coefficient values, where M<N, the filter being operable to determine the filter tap characteristics comprising the method steps of:

connecting a pivot tap to a first tap of the delay line
replacing the pivot filter tap with a variable filter tap and connecting the pivot to one of the N−1 locations remaining; and,
at each pivot location optimising the first co-efficient value according to a selected optimality criterion;
wherein the search is terminated when the best location for the pivot tap has been determined;
determining a subset of optimal locations;
determining filter tap values for said optimal locations wherein, for each sequential step of the process, M−1 variable coefficients and one pivot are provided;
and the variable coefficients are connected to those delay line taps which were determined to be optimal in step M−1;
wherein the mth pivot is scanned through the unused N−M−1 delay line taps remaining and the best one is found as before. and best location of the movable coefficient is decided according to a minimum residual power criterion.

Conveniently, the optimality criterion is output power and best location of the movable coefficient is decided according to a minimum residual power criterion.

The invention thus provides a method for reducing the computation load of digital equalisers for CDMA cellular wireless receivers, particularly in the European UTRA implementation of third generation cellular radio. For downlink transmission in synchronous TDD mode the handsets/terminals will use a common equaliser which whitens the channel impulse response and thereby removes mutual interference between users. This technique thus minimises the number of taps in this channel equaliser and hence the computation load of such digital equalisers.

BRIEF DESCRIPTION OF THE FIGURES

For a better understanding of the invention and to show how the same may be carried into effect, there will now be described by way of example only, specific embodiments, methods and processes according to the present invention with reference to the accompanying drawings in which.

DETAILED DESCRIPTION OF THE PREFERRED EMBODIMENTS

There will now be described by way of example the best mode contemplated by the inventors for carrying out the invention. In the following description, numerous specific details are set out in order to provide a complete understanding of the present invention. It will be apparent, however, to those skilled in the art that the present invention may be put into practice with variations of the specific.

Figure 2:
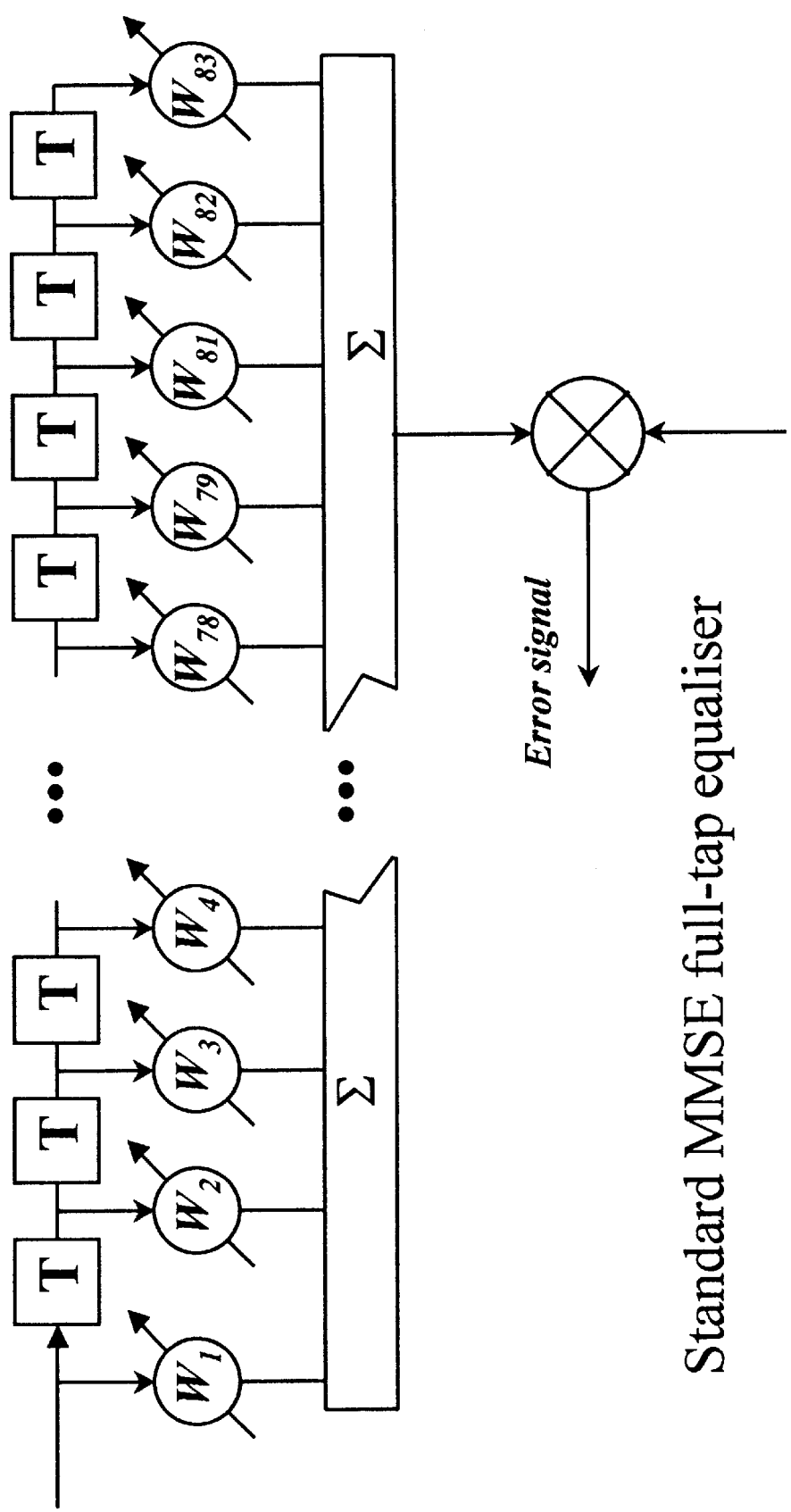
FIG. 2 shows a basic FIR filter.

FIG. 2 shows a basic FIR filter, used as an equaliser for an arbitrary channel, which has a full set of taps. In the proposed UTRA third generation case the number of taps could be more than 80. The filter tap values are optimised by one of several criteria. Examples of optimum criteria are the zero-forcing solution [Proakis, Juntti], minimum mean square error of the filter output during the training sequence (which is known at the receiver), and nfinally the constrained minimum output power criterion. These criteria will, with varying degrees of efficiency, minimise the mutual interference between different users who are attempting to use orthogonal CDMA spreading codes on the channels.

Figure 1:
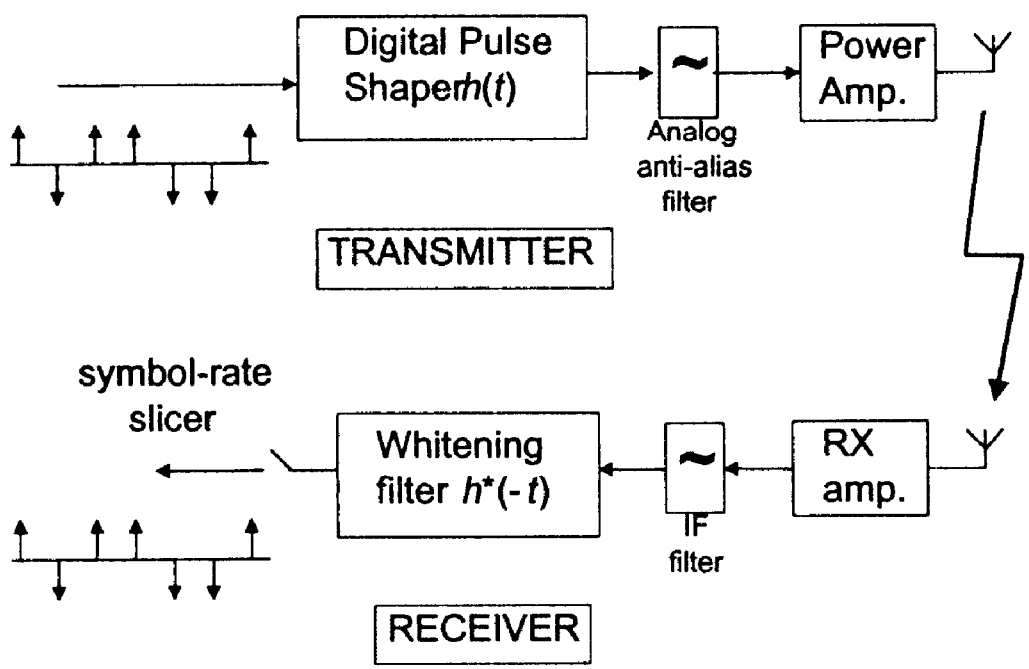
FIG. 1 shows a typical installation of a pulse shaper in a digital communications system.
Figure 3:
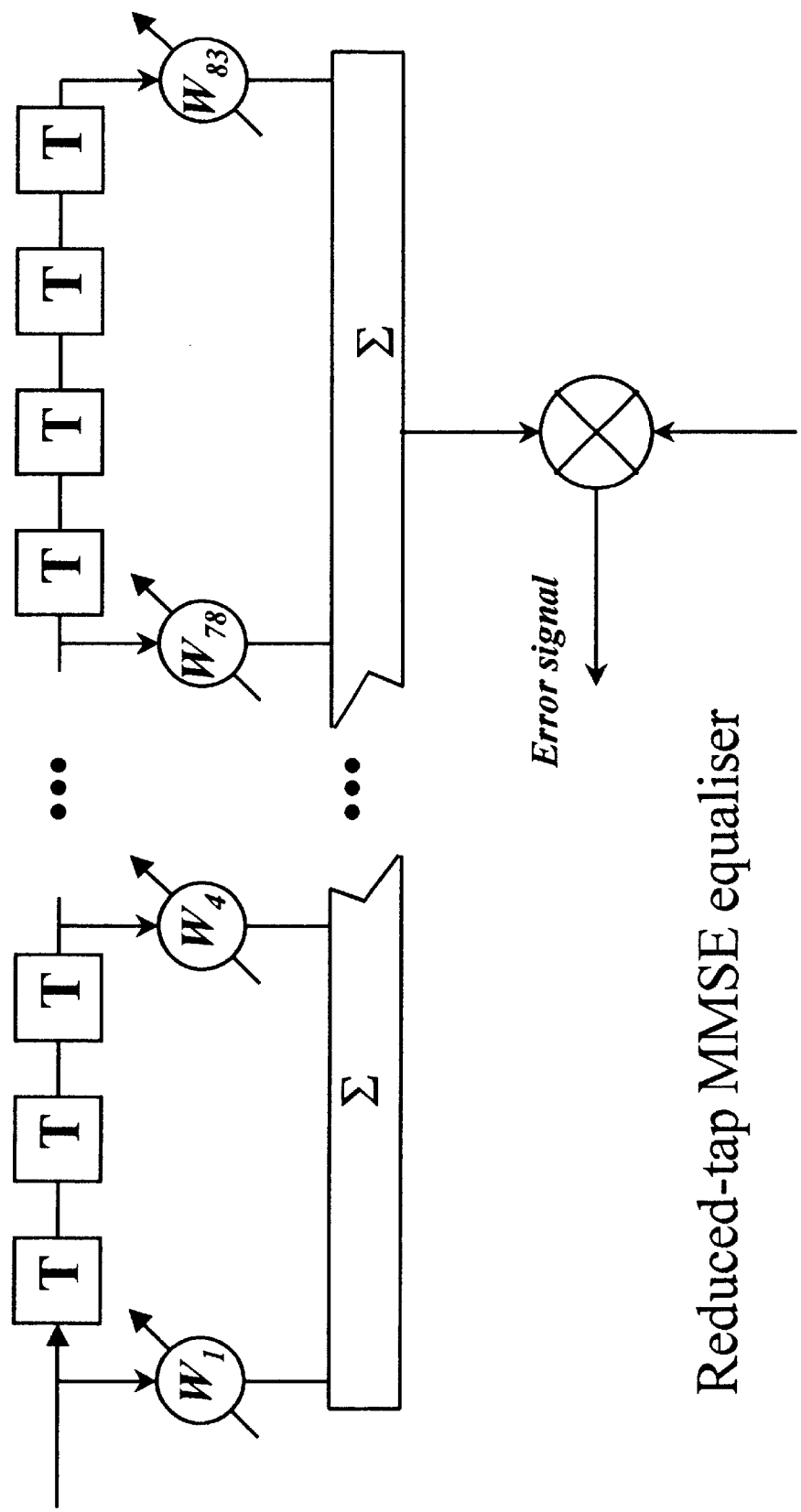
FIG. 3 shows a filter having a reduced nature of taps.

FIG. 3 shows a filter with a reduced number of coefficients, though which retains the same potential time span of the filter shown in FIG. 1. The operation of this filter is predicated on the hypothesis that a sparse tap space is a near-optimum space in which to operate the equaliser. The least-squares optimality criterion is still applied but now there are additional initial steps which must be taken to optimise the filter. These steps comprise a selection of the number of active taps, and a selection of the locations of the active taps. The optimum tap coefficient values vary whenever the number of taps and their locations are changed and for each selection the coefficient values are optimised according the least squares criterion.

Determination of the locations of the taps is a discrete optimisation problem. In principle, if there is no better method available then exhaustive search could be used. For M active coefficients and N potential tap locations the number of combinations to be searched, noting that the ordering of the taps is not significant because of the independent coefficient optimisation procedure, is:

$$N_{SEL} = \binom{N}{M} = \frac{N!}{(N-M)!M!}$$

For the case under discussion, we might have N=83, M=6 and $N_{SEL}=3.8\times10^8$, which is too large for practical search.

In a first method in accordance with the invention comprises a sequential decision procedure to determine filter tap values and the filter tap locations. This is split into a search phase and a permutation phase. The operation of the method can be described equally by a physical search procedure or by a high level algorithm which is computationally more efficient. It is to be noted that the optimisation of filter tap coefficients is a constant process: the algorithm is ideally as computationally short as possible.

Figure 4:
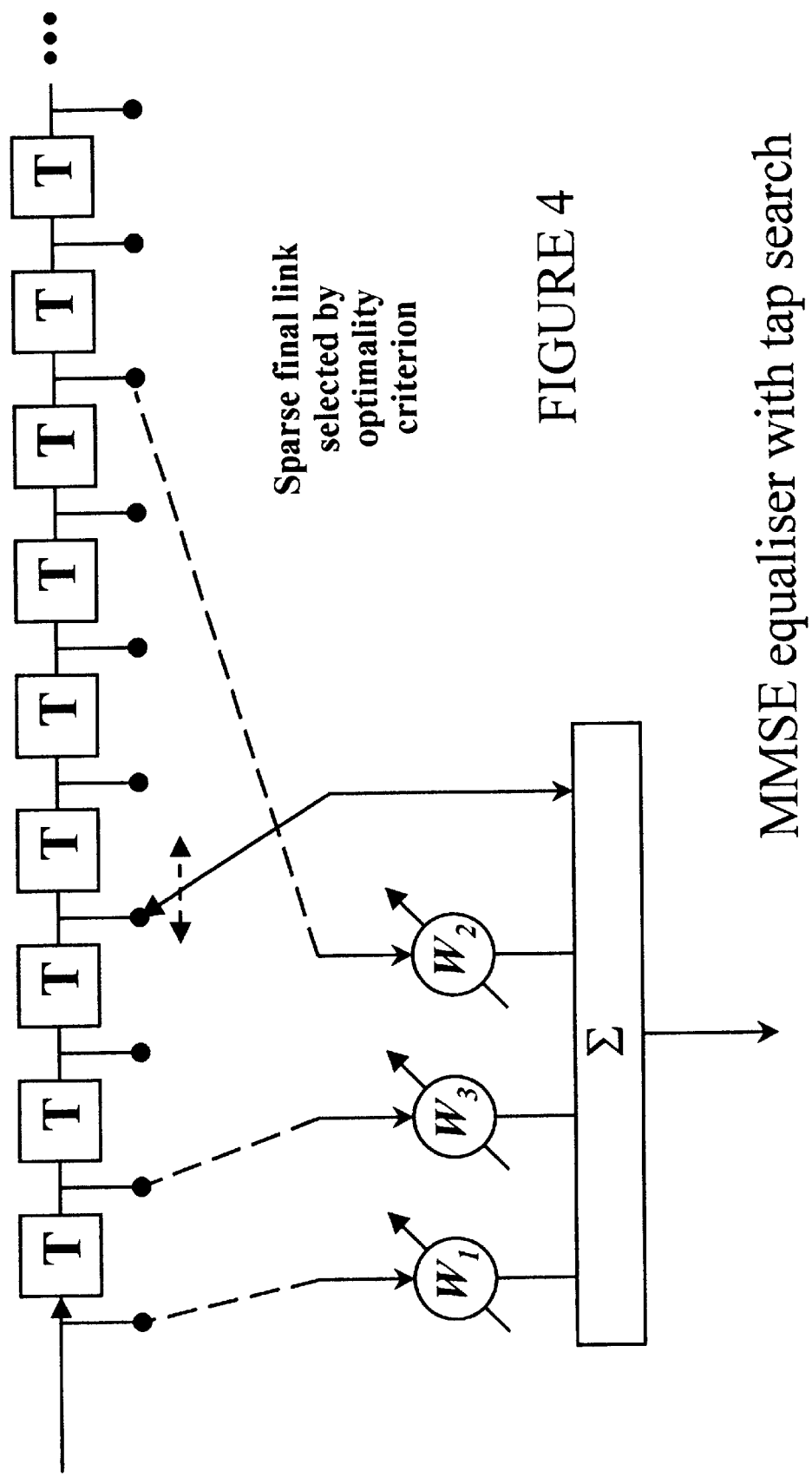
FIG. 4 shows a filter in accordance with an embodiment of the invention.

Referring now to FIG. 4, there is shown FIR filter with floating tap connections and variable coefficient values. One of the taps has a coefficient value of one and will be referred to as a "pivot tap" while the remainder of the co-efficient have variable values.

In a first search the pivot tap is connected to the first tap of the delay line and there are no variable coefficients. This solution is satisfactory if the channel is ideal and contributes no dispersion to the signals.

In a second search step a variable coefficient replaces the pivot and the pivot is connected to one of the N-1 locations remaining. At each pivot location the first co-efficient value is optimised according the selected optimality criterion, which, for this example, is output power and best location of the movable coefficient is decided according to a minimum residual power criterion. Other criteria can be selected such as and others. The search phase is terminated when the best location for the pivot tap has been determined. Two optimum locations on the delay line have now been determined.

In an mth search step of the algorithm, M-1 variable coefficients and one pivot are provided. The variable coefficients are connected to those delay line taps which were determined to be optimal in step M-1. The mth pivot is scanned through the unused N-M-1 delay line taps remaining and the best one is found as before.

Having determined a subset of preferred locations on the tapped delay line, such preferred locations, though not the coefficient values, are made permanent. A further optimisation procedure is then used to determine the best tap to use a pivot within this set. This requires the optimality criterion to be tested when each of the preselected delay line locations is used as the pivot in turn. This phase of the algorithm compensates for the possibility of weak precursors in the channel impulse response (a non minimum-phase channel).

A preferred fashion of implementing the search for the best taps is via a numerical algorithm comprising pivoted Cholesky triangularisation using Givens' rotations, which is described in detail as follows.

The selection method described can be replaced by an algorithm which determines the same filter tap locations but in a more efficient fashion using matrix manipulations.

The estimated channel impulse response values $\{h_0, h_1, h_2 \ldots h_N\}$ are written row by row into a channel impulse response matrix H:

$$H = \begin{bmatrix} h_0 & h_1 & h_2 & h_3 & h_4 & h_5 & h_6 & 0 & 0 & 0 & 0 \\ 0 & h_0 & h_1 & h_2 & h_3 & h_4 & h_5 & h_6 & 0 & 0 & 0 \\ 0 & 0 & h_0 & h_1 & h_2 & h_3 & h_4 & h_5 & h_6 & 0 & 0 \\ 0 & 0 & 0 & h_0 & h_1 & h_2 & h_3 & h_4 & h_5 & h_6 & 0 \\ 0 & 0 & 0 & 0 & h_0 & h_1 & h_2 & h_3 & h_4 & h_5 & h_6 \end{bmatrix} \quad (A1)$$

A Givens' rotation algorithm is applied to reduce the H matrix to a lower triangular form, as follows:

Using a sequence of N-1 2×2 rotation operations the top row is made zero to the right of the first element. The rotations are implemented as follows. Elements j and k are estimated with value $x_j$ and $x_k$. The 2×2 matrix rotation operation which sets $x_k$ to zero has the form:

$$\begin{bmatrix} \cos(\theta) & \sin(\theta) \\ -\sin(\theta) & \cos(\theta) \end{bmatrix} \cdot \begin{bmatrix} x_j \\ x_k \end{bmatrix} = \begin{bmatrix} 0 \\ y_k \end{bmatrix} \quad (A2)$$

It can easily be determined that:

$$\cos(\theta) = \frac{x_j}{\sqrt{x_j^2 + x_k^2}} \quad \sin(\theta) = \frac{x_k}{\sqrt{x_j^2 + x_k^2}} \quad (A3)$$

These rotations are applied to the following pairs of elements in the top row: 1,2; 1,3; 1,4; ... 1,N which results in the setting to zero of the elements 2, ... ,N. Identical sequences of rotations are copied and applied in the same order to the second and subsequent rows. Since these rotation copies do not relate to the values of the elements in these subsequent rows the lower rows are not reduced to zero.

The second row is then set to zero to the right of the second element by applying N-2 pivoting operations to element pairs 2,3; 2,4; 2,N. Identical sequences of rotations are copied and applied in the same order to the third and subsequent rows.

Permuting operations are then performed; this comprises the exchanges of rows. Such exchanges are made in order to change the order of the rows in L and bring a row from candidates m (the default), m+1, ... ,M up into the mth position. The criterion for selecting the appropriate row is that the residual diagonal element $I_{mm}$ should be. a minimum after the candidate row has been set to zero on the right of the mth (diagonal) element.

This procedure is repeated n times where n is determined to be in the range, of 0–20. For an ideal channel, once the Givens' algorithm has been applied no further processing is required; for a non-ideal channel, the determination of the positions and values of low weights is sufficient and, in any case, maintains processing words to an optimum end. In some receivers the available processing power may limit this number still further: for the mth step. The mth row is set to zero to the right of the mth (diagonal) element by applying N-m pivoting operations to element pairs (m,m+1), (m,m+2), ... (m,N).

After step m=3 the matrix is as follows:

$$H = \begin{bmatrix} l_{11} & 0 & 0 & 0 & 0 & 0 & 0 & 0 & 0 & 0 & 0 \\ l_{21} & l_{22} & 0 & 0 & 0 & 0 & 0 & 0 & 0 & 0 & 0 \\ l_{31} & l_{32} & l_{33} & 0 & 0 & 0 & 0 & 0 & 0 & 0 & 0 \\ x_{41} & x_{42} & x_{43} & x_{44} & x_{45} & x_{46} & x_{47} & x_{48} & x_{49} & x_{4,10} & x_{4,11} \\ x_{451} & x_{52} & x_{53} & x_{54} & x_{55} & x_{56} & x_{57} & x_{58} & x_{5,9} & x_{5,10} & x_{5,11} \end{bmatrix} \quad (A4)$$

The resulting lower triangular matrix L and the orginal H matrix are related to the autocovariance matrix of the data sequence $\{X\}$ as follows:

$$LL^H = HH^H = \Phi \quad (A5)$$

In the application of the pivoting strategy, it can be shown the modulus squares of the diagonal elements in the lower triangular factor are equal to the residual powers in the pivot-search equaliser discussed earlier. This is discussed in C. W. Therrian: "On the relation between Triangular Matrix Decomposition and Linear Prediction", IEEE Proceeding, 71(12), December 1983, pp.1459–1460. Thus there is a one to one relationship between a row pivoting algorithm applied to the Givens triangular reduction and the search for optimum pivot locations in the adaptive equaliser.

It is not necessary to explicitly perform these rotations to find the $l_{mm}$ value. The diagonal value of rows from m and below can be predicted without completing all the row rotations. Since the rotations are a sequence of orthogonal transforms, the complete-row $L_2$-norms of any row are invariant under the rotations:

$$x_{m,1}^2 + x_{m,2}^2 + x_{m,3}^2 + \ldots x_{m,N}^2 + S_{m1} \text{ for } \forall m \quad (A6)$$

Moreover, whatever rotations are applied to element m and to its right the partial row $L_2$-norms:

$$S_{mm} = x_{m,m}^2 + x_{m,m+1}^2 + x_{m,m+2}^2 + \ldots x_{m,n}^2 \quad (A7)$$

are also invariant. We can use the following formula to find the value of $l_{mm}^2$, when row m is fully set to zero to the right of the mth element:

$$S_m = K - (l_{m,1}^2 + l_{m,2}^2 + l_{m,3}^2 + \ldots l_{m,m-1}^2) \quad (A8)$$

The partial sums on the right of equation (A8) are updated after each row is pivoted and this is a relatively efficient procedure so long as the triangularisation procedure is terminated after a small number of row.

The row-pivoted factor L' bears the following relationship to the row- and column-pivoted covariance matrix $\Phi'$. If rows (i, k) of L' are exchanged, then rows (j, k) of the channel impulse response matrix H and rows (j, k) and columns (j, k) of $\Phi'$ are also exchanged. We have:

$$L'L'^H = H'H'^H = \Phi' \quad (A9)$$

thus L' is the regular lower Cholesky decomposition of the doubly-pivoted matrix $\Phi'$.

If the triangular reduction of H is terminated prematurely after permuting a subset j,k, ... m of its rows to the leading positions then the partial factor $L_p'$ is the standard Cholesky factor of the similarly ordered submatrix $\Phi_p'$.

The next stage of the process is the determination of the physical tap weights. Extracting the co-efficient values from the triangular factor proceeds as follows. It is known that the $L_p'$ factor is the standard lower triangular factor of some row and column pivoted version m×m submatrix $\Phi_p'$ of the original full covariance matrix $\Phi$. Dropping the sub- and superscripts, which are henceforth taken as assumed, we have:

$$\Phi = LL^H \quad (A10)$$

The optimum filter weights for an end-pivoted filter are given by:

$$W = \Phi^{-1} e_m = L^{-H} L^{-1} e_m \quad (A11)$$

where $e_m$ is an elementary vector $(0,0, \ldots 1)^T$.

Since $L^{-1}$ is lower triangular, $L^{-1} e_m = (L^{-1})_{NN} e_m$.

Therefore W has the form:

$$W = (L^{-1})_{NN} L^{-H} e_m = (L^{-1})_{NN} \text{Column}_1(L^{-H}) \quad (A12)$$

To obtain W it is necessary to invert the L factor and extract its leading column which, using the efficiency made possible in lower triangular matrix operations is an $O(m^2)$ process. Finally the element locations in W must be mapped back through an inverse permutation map in order to relate them to taps on the original digital filter.

These operations are illustrated by the following real-valued calculation. The channel impulse response is the sequence $\{0.2, 1.0, 0, 0, 0.5\}$ giving rise to the impulse response matrix:

$$H = \begin{bmatrix} 0.2 & 1 & 0 & 0 & 0.5 & 0 & 0 & 0 & 0 \\ 0 & 0.2 & 1 & 0 & 0 & 0.5 & 0 & 0 & 0 \\ 0 & 0 & 0.2 & 1 & 0 & 0 & 0.5 & 0 & 0 \\ 0 & 0 & 0 & 0.2 & 1 & 0 & 0 & 0.5 & 0 \\ 0 & 0 & 0 & 0 & 0.2 & 1 & 0 & 0 & 0.5 \end{bmatrix} \quad (A13)$$

This channel matrix corresponds to the following autocovariance matrix:

$$\Phi = \begin{bmatrix} 1.29 & 0.2 & 0 & 0.5 & 0.1 \\ 0.2 & 1.29 & 0.2 & 0 & 0.5 \\ 0 & 0.2 & 1.29 & 0.2 & 0 \\ 0.5 & 0 & 0.2 & 1.29 & 0.2 \\ 0.1 & 0.5 & 0 & 0.2 & 1.29 \end{bmatrix} \quad (A14)$$

From this matrix a 3×3 submatrix is drawn using rows and columns 1,2,4.:

$$\Phi_p' = \begin{bmatrix} 1.29 & 0.2 & 0 \\ 0.2 & 1.29 & 0.5 \\ 0 & 0.5 & 1.29 \end{bmatrix} \quad (A15)$$

and we get the weight vector solution:

$$\Phi_p^{-1} e_3 \begin{bmatrix} 0.9388 & -0.1455 & 0.3639 \\ -0.1455 & 0.7978 & 0.0564 \\ 0.3639 & 0.0564 & 0.9162 \end{bmatrix} \cdot \begin{bmatrix} 0 \\ 0 \\ 1 \end{bmatrix} = \begin{bmatrix} 0.3639 \\ 0.0564 \\ 0.9162 \end{bmatrix} = \alpha \begin{bmatrix} 0.3971 \\ 0.0616 \\ 1 \end{bmatrix} \quad (A16)$$

Following the Givens' rotation route, reduction of the H matrix to standard lower triangular form by rotations leads to $$H'_p = \begin{bmatrix} 0.2 & 1 & 0 & 0 & 0.5 & 0 & 0 & 0 \\ 0 & 0.2 & 1 & 0 & 0 & 0.5 & 0 & 0 \\ 0 & 0 & 0 & 0.2 & 1 & 0 & 0 & 0.5 \end{bmatrix} \Rightarrow \begin{bmatrix} 1.1358 & 0 & 0 \\ 0.1761 & 1.122 & 0 \\ 0.4402 & -0.0691 & 1.0447 \end{bmatrix} \quad (A17)$$

We have:

$$H_p H_p^H = L_p L_p^H = \Phi_p \quad (A18)$$

which is a scaled version of the optimal weight vector. The inverse of the L factor is:

$$L_p^{-H} = \begin{bmatrix} 0.8805 & -0.1382 & -0.3801 \\ 0 & 0.8912 & 0.0589 \\ 0 & 0 & 0.9572 \end{bmatrix} \quad (A19)$$

and it can be seen that the last column of this inverse is a scaled version of the last column of $\Phi^{-1}$ and so the weight vector can be derived directly from this factor.

The final operation is to determine which coefficient forms the best pivot, given that the locations of the active delay line taps are fixed at this point.

Since the solution above only gives the weight for an end pivoted condition his has to be done by deterministic end-around vertical rotations of the L factor followed by retriangularisations.

Given the following L factor:

$$L = \begin{bmatrix} l_{11} & 0 & 0 \\ l_{21} & l_{22} & \\ l_{31} & l_{32} & l_{33} \end{bmatrix} \quad (A20)$$

we can derive the solution with the third tap is pivot. An upward rotation by one yields:

$$\tilde{L} = \begin{bmatrix} l_{21} & l_{22} & 0 \\ l_{31} & l_{32} & l_{33} \\ l_{11} & 0 & 0 \end{bmatrix} \xrightarrow{Triang} \begin{bmatrix} \tilde{l}_{11} & 0 & 0 \\ \tilde{l}_{21} & \tilde{l}_{22} & 0 \\ \tilde{l}_{31} & \tilde{l}_{32} & \tilde{l}_{33} \end{bmatrix} \quad (A21)$$

from which the solution with the first tap as pivot is formed. It is not necessary to permute the variable coefficients' locations since these are determined by the least squares criterion and do not depend on permutations of the their input connections.

The TDD modes of UTRA and CDMA2000 are specifically targeted in the description as a specific application but such filters may also be used, with some slight modification, as RAKE filters in the FDD modes of the same systems.

The filter circuits are conveniently constructed as a semiconductor chip, preferably as an Application Specific Integrated Circuit (ASIC), as is well known in the art. Alternatively, the filter circuits could be implemented as a Floating Point Gate Array (FPGA).

What is claimed is:

1. A method of determining the filter taps for a digital filter on a non-ideal channel comprising the steps of:
   obtaining impulse response values $\{h_0, h_1, h_2, \ldots h_N\}$ to create a channel response matrix H;
   applying Givens' rotation algorithm to the matrix H comprising the sub-steps of:
   i) using a sequence of N−1 2×2 rotation operations a top row of the matrix is made zero to the right of a first diagonal element of the matrix;
   ii) copying and applying identical sequences of rotations in the same order to second and subsequent rows of the matrix; and
   iii) permuting the matrix to achieve a best value for a second diagonal element of the matrix;
   iv) repeating steps i) and ii) for the second row with a corresponding reduction to zero of elements of each row to the right of the diagonal of the matrix;
   v) repeating steps iii) and iv) for subsequent rows up to a limit so as to produce a lower triangular matrix L;
   inverting the matrix L;
   and extracting a leading column of the inverted matrix and mapping element locations in the inverted matrix back through an inverse pivot map,
   such that for each element of the leading column the mapped value of a permuted row number corresponds to the number of a selected tap to be employed of the filter and the element of the leading column corresponds to the desired weight for that tap of the filter.

2. A method according to claim 1 wherein the limit is determined to be in a range of 0 −20.

3. A method according to claim 1 wherein the channel is a CDMA channel.

4. In a filter for a non-ideal channel having a delay line with N stages and M connections with variable coefficient values, where M<N, a method of determining the filter tap characteristics comprising the steps of:
   connecting a pivot tap to a first tap of the delay line;
   replacing the pivot tap with a variable filter tap and connecting the pivot tap to one of the N−1 locations remaining; and,
   at each remaining pivot location optimising a first co-efficient value according to a selected optimality criterion until a best location for the pivot tap has been determined;
   determining a subset of optimal locations;
   determining filter tap values for said optimal locations wherein, for each sequential step of the process, m−1 variable coefficients and one pivot are provided;
   and the variable coefficients are connected to a subset of delay line taps which were determined to be optimal in step m−1;
   wherein the mth pivot tap is scanned through the unused N−m−1 delay line taps remaining and a best location is found as before.

5. A method according to claim 4 wherein the optimality criterion is output power and the best location for the pivot tap is decided according to a minimum residual power criterion.

6. A digital filter having a plurality of filter taps wherein the filter is operable such that a sparse subset of filter taps may be determined according to the following steps:
   obtaining impulse response values $\{h_0, h_1, h_2, \ldots h_N\}$ to create a channel response matrix H;
   applying Givens' rotation algorithm to the matrix H comprising the sub-steps of:
   i) using a sequence of N−1 2×2 rotation operations a top row of the matrix is made zero to the right of a first diagonal element of the matrix;

ii) copying and applying identical sequences of rotations in the same order to second and subsequent rows of the matrix; and iii) permuting the matrix to achieve a best value for a second diagonal element of the matrix;

iv) repeating steps i) and ii) for the second row with a corresponding reduction to zero of elements of each row to the right of the diagonal of the matrix;

v) repeating steps iii) and iv) for subsequent rows up to a limit so as to produce a lower triangular matrix L;

inverting the matrix L;

and extracting a leading column of the inverted matrix and mapping element locations in the inverted matrix back through an inverse pivot map, such that for each element of the leading column the mapped value of a permuted row number corresponds to the number of a selected tap to be employed of the filter and the element of the leading column corresponds to the desired weight for that tap of the filter.

7. A digital filter according to claim 6 wherein the limit is determined to be in the range of 0–20.

8. A digital filter according to claim 6 wherein the channel is a CDMA channel.

9. A filter for a non-ideal channel having a delay line with N stages and M connections with variable coefficient values, where M<N, the filter being operable to determine the filter tap characteristics comprising the method steps of:

connecting a pivot tap to a first tap of the delay line;

replacing the pivot tap with a variable filter tap and connecting the pivot tap to one of the N−1 locations remaining; and, at each remaining pivot location optimising a first co-efficient value according to a selected optimality criterion until a best location for the pivot tap has been determined;

determining a subset of optimal locations;

determining filter tap values for said optimal locations wherein, for each sequential step of the process, m−1 variable coefficients and one pivot are provided;

and the variable coefficients are connected to a subset of delay line taps which were determined to be optimal in step m−1;

wherein the mth pivot tap is scanned through the unused N−m−1 delay line taps remaining and a best location is found as before.

10. A filter according to claim 9 wherein the optimality criterion is output power and best location for the pivot tap is decided according to a minimum residual power criterion.

11. A signal having been processed by a digital filter having a plurality of filter taps wherein the filter is operable such that a sparse subset of filter taps may be determined according to the following steps:

obtaining impulse response values $\{h_0, h_1, h_2, \ldots h_N\}$ to create a channel response matrix H;

applying Givens' rotation algorithm to the matrix H comprising the sub-steps of:

i) using a sequence of N−1 2×2 rotation operations a top row of the matrix is made zero to the right of a first diagonal element of the matrix;

ii) copying and applying identical sequences of rotations in the same order to second and subsequent rows of the matrix; and iii) permuting the matrix to achieve a best value for a second diagonal element of the matrix;

iv) repeating steps i) and ii) for the second row with a corresponding reduction to zero of elements of each row to the right of the diagonal of the matrix;

v) repeating steps iii) and iv) for subsequent rows up to a limit so as to produce a lower triangular matrix L;

inverting the matrix L;

and extracting a leading column of the inverted matrix and mapping element locations in the inverted matrix back through an inverse pivot map, such that for each element of the leading column the mapped value of a permuted row number corresponds to the number of a selected tap to be employed of the filter and the element of the leading column corresponds to the desired weight for that tap of the filter.

12. A receiver incorporating the filter as claimed in claim 6.

13. A transmitter incorporating the filter as claimed in claim 6.

14. In a filter for a non-ideal channel having a delay line with N stages and M connections with variable coefficient values, where M<N, a method of determining the filter tap characteristics comprising the steps of:

a first step of connecting a pivot tap to a first tap of the delay line;

a second step of replacing the pivot tap with a first variable filter tap and scanning the pivot tap through the N−1 locations remaining and at each remaining pivot location optimising the co-efficient value of the first variable filter tap according to a selected optimality criterion until a best location for the pivot tap has been determined; and an mth step of determining a subset of m−1 previously selected optimal locations and the last determined best pivot tap location; connecting the variable coefficients to said sub-set of optimal locations and replacing the last pivot tap with an mth variable filter tap; and scanning the pivot tap through N−m−1 locations remaining and optimising the co-efficient value of the mth variable filter tap until a best location for the pivot tap has been determined as before.

15. A method according to claim 14 wherein the optimality criterion is output power and the best location for the pivot tap is decided according to a minimum residual power criterion.

16. A filter for a non-ideal channel having a delay line with N stages and M connections with variable coefficient values, where M<N the filter being operable to determine the filter tap characteristics comprising the method steps of:

a first step of connecting a pivot tap to a first tap of the delay line;

a second step of replacing the pivot tap with a first variable filter tap and scanning the pivot tap through the N−1 locations remaining and at each remaining pivot location optimising the co-efficient value of the first variable filter tap according to a selected optimality criterion until a best location for the pivot tap has been determined; and an mth step of determining a subset of m−1 previously selected optimal locations and the last determined best pivot tap location; connecting the variable coefficients to said sub-set of optimal locations and replacing the last pivot tap with an mth variable filter tap; and scanning the pivot tap through N−m−1 locations remaining and optimising the co-efficient value of the mth variable filter tap until a best location for the pivot tap has been determined as before.

17. A filter according to claim 16 wherein the optimality criterion is output power and best location for the pivot tap is decided according to a minimum residual power criterion.

* * * * *